United States Patent [19]

Tabuchi

[11] Patent Number: 5,175,443

[45] Date of Patent: Dec. 29, 1992

[54] MEMBRANE SWITCH

[75] Inventor: Masazumi Tabuchi, Osaka, Japan

[73] Assignee: Sharp Kabushiki Kaisha, Osaka, Japan

[21] Appl. No.: 657,774

[22] Filed: Feb. 20, 1991

[30] Foreign Application Priority Data

Feb. 21, 1990 [JP] Japan .................. 2-40528
Feb. 19, 1991 [JP] Japan .................. 3-024675

[51] Int. Cl.⁵ .......................... H01H 35/02
[52] U.S. Cl. .................. 307/119; 200/5 R; 307/125; 307/139
[58] Field of Search ........... 200/5 R, 5 A; 307/112, 307/116, 119, 125, 134, 139

[56] References Cited

U.S. PATENT DOCUMENTS

| | | | |
|---|---|---|---|
| 3,728,501 | 4/1973 | Larson et al. | 200/52 |
| 3,879,593 | 4/1975 | Larson | 200/159 B |
| 3,987,259 | 10/1976 | Larson | 200/5 A |
| 4,017,697 | 4/1977 | Larson | 200/5 A |
| 4,320,573 | 3/1983 | Larson | 200/5 A |
| 4,536,625 | 8/1985 | Bebie | 200/5A |
| 4,652,704 | 3/1987 | Franklin | 200/5 A |

FOREIGN PATENT DOCUMENTS 57-45633 10/1982 Japan .
60-25785 8/1985 Japan .
1-32665 10/1989 Japan .

Primary Examiner—Jeffrey A. Gaffin
Attorney, Agent, or Firm—Nixon & Vanderhye

[57] ABSTRACT

In a switch apparatus having a membrane structure, when it is detected that a conductive pattern comes into contact with both of two conductive patterns, it is judged that a normal ON operation is performed, and an ON signal is output. When the conductive pattern comes into contact with only one of the two conductive patterns, it is judged that a failure such as a short-circuit due to peeling occurs, and an alarm signal is output. The switch apparatus has a self-detecting function, so that it reliably detects an unstable condition of a failure such as a short-circuit due to peeling.

19 Claims, 7 Drawing Sheets

FIG. 1
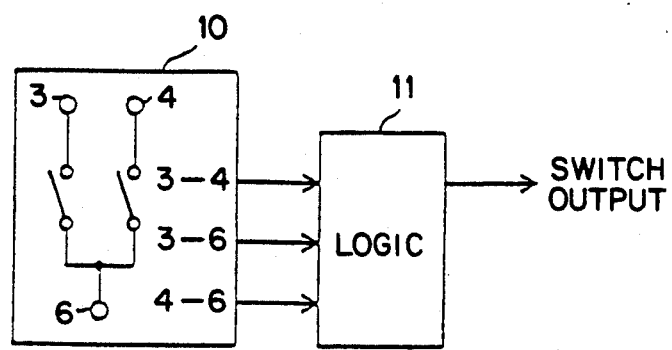
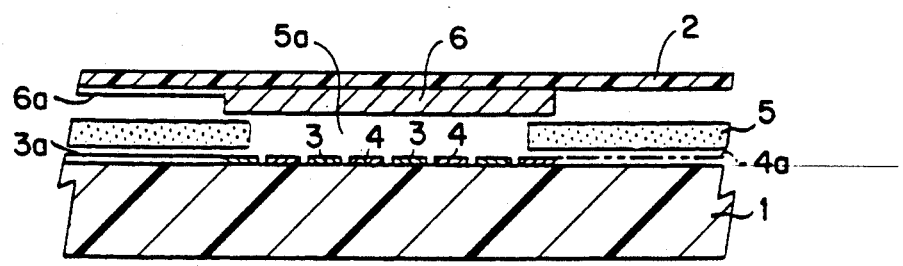
FIG. 2
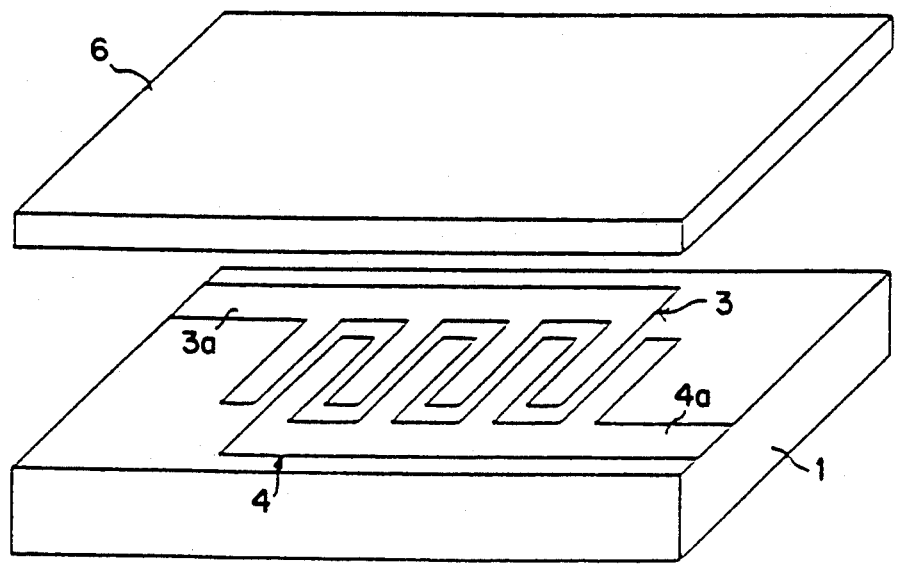
FIG. 3

FIG. 8
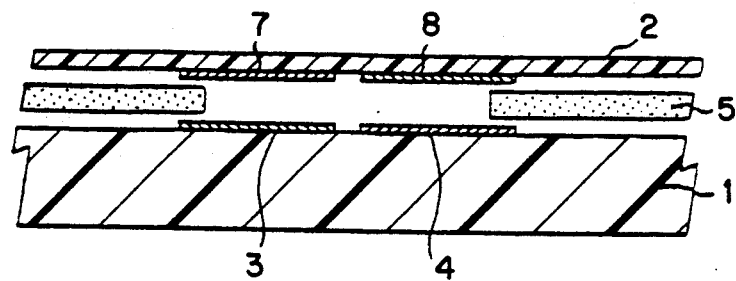
FIG. 9
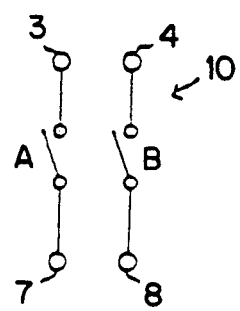
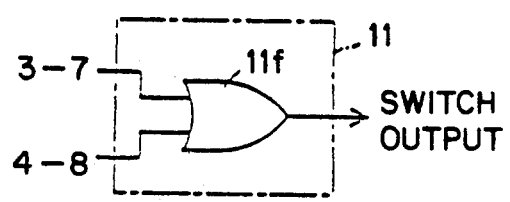
FIG. 10

MEMBRANE SWITCH

BACKGROUND OF THE INVENTION

1. Field of the Invention

The present invention relates to a switch apparatus with a membrane switch which is useful as a control switch of an electronic device or the like.

2. Description of the Prior Art

A membrane switch is a switch in which a resin panel is disposed on a substrate via a spacer having an opening which is in an operating portion. When the operating portion of the resin panel is pressed, conducting members disposed in the operating portion are short-circuited.

One example of such a membrane switch is shown in FIG. 14. In this example, flat patterns 3 and 4 which are electrically conductive are formed on the upper surface of a substrate 1 and on the lower surface of a resin panel 2, respectively. When the resin panel 2 is pressed from above, the conductive patterns 3 and 4 which have been separated from each other by a spacer 5 come into contact with each other to be short-circuited, whereby the switch turns ON.

Another example of a conventional membrane switch is shown in FIGS. 15 and 16. In this example, two comb-shaped conductive patterns 3 and 4 are formed on the upper surface of a substrate 1, and an electrically conductive pattern 6 made of conductive rubber is stuck on the lower surface of a resin panel 2. When the resin panel 2 is pressed from above, the conductive pattern 6 comes into contact with the conductive patterns 3 and 4 to short-circuit the two patterns, whereby the switch turns ON.

Membrane switches having the above-mentioned structure, however, are disadvantageous in that the conductors functioning as contact points easily peel off, in particular, the conductive pattern 4 and conductive pattern 6 on the resin panel 2 are prone to peel off because the resin panel 2 is deformed by the pressing operation. The short-circuited state due to the peeling is difficult to distinguish from the short-circuited state in the normal switch operation, because these short-circuited states are mostly unstable. When a break occurs between the conductor and a lead due to the peeling of the conductor, it is impossible to distinguish this breaking state from the non-operation state. In conventional membrane switches, failures due to the peeling of conductors easily happen, and cannot be easily detected. Therefore, conventional membrane switches have a problem in that they cannot be used for devices which are required to have high reliability.

When the conductors are short-circuited as a result of the peeling of one of the conductors, the switch turns ON without attracting anyone's attention. Therefore, some switches are provided with a function that the period of time for which the switch continues to be in the ON state is monitored and if the ON state continues for a predetermined period of time (e.g. 10 seconds) or more, the ON state is judged not to be a normal one caused by the operation of a person, thereby sending an alarm signal. A conventional switch apparatus having such a function will be described with reference to FIGS. 17 and 18.

In this switch apparatus, a conductive pattern 3 is connected to a constant voltage source through a resistor 21, and a conductive pattern 4 is grounded. The connecting point 22 between the conductive pattern 3 and the resistor 21 is connected to a microcomputer 23. The microcomputer 23 detects the potential of the connecting point 22 to judge whether the switch is in the ON state or not. FIG. 18 shows a flow of the switch state detecting routine in the microcomputer 23. The switch state detecting routine is called every 100 milliseconds by a timer interruption. First, it is examined whether the conductive patterns 3 and 4 are electrically connected or not, in other words, whether the potential of the connecting point 22 is low or not (step S21). If the potential of the connecting point 22 is not low, a counter in the microcomputer 23 is reset (step S26), and the process returns to the main routine. If the potential of the connecting point 22 is low at step S21, the counter is incremented by 1 (step S22). In step S23, it is examined whether the contents of the counter exceed 100 or not (in other words, whether the potential of the connecting point 22 is continuously low for 10 seconds or longer or not). In normal operation, the switch will not be operated continuously for 10 seconds or more, so that the process proceeds to step S24. In step S24, it is examined whether the contents of the counter are equal to 2 or not. If the contents are not equal to 2, the process returns to the main routine. If the contents are equal to 2, the process proceeds to step S25, at which the switch ON process is performed. If the contents of the counter exceed 100 at step S23 (in other words, if the potential of the connecting point 22 is continuously low for 10 seconds or more), it is judged that a failure has occurred, and an alarm signal is dispatched. According to the above-described process, in the second switch state detecting routine after the switch operation (i.e., when the ON operation continues for about 0.2 seconds or more), the computer performs the switch ON process. When the ON state continues for 10 seconds or longer, an alarm for switch failure is given.

In some of the short-circuit failures due to the peeling of a conductor in a switch having the membrane structure, the switch turns ON only when being vibrated because of the unstable contact between the conductors. Such a short-circuit in a short time can not be detected by the above-mentioned failure detection. Accordingly, the failure detection is not sufficiently performed in a prior art switch apparatus.

SUMMARY OF THE INVENTION

The switch apparatus of this invention, which overcomes the above-discussed and numerous other disadvantages and deficiencies of the prior art, has a membrane structure and comprises an operating portion, said switch apparatus being able to be activated when said operating portion is operated, and further comprises: three or more conducting members, said conducting members being electrically insulated from each other when said operating portion is not operated, conducting members of two or more combinations of said conducting members being electrically connected with each other when said operating portion is operated; and output means for outputting an ON signal in the case where conducting members of one or more predetermined combinations of said conducting members are electrically connected with each other.

In preferred embodiments, said output means comprises a logic circuit.

In preferred embodiments, said case where conducting members of one or more predetermined combinations of said conducting members are electrically connected with each other is the case where conducting members of all combinations of said conducting members are electrically connected with each other.

Another switch apparatus according to the invention has a membrane structure and comprises an operating portion, said switch apparatus being able to be activated when said operating portion is operated, and further comprises: three or more conducting members, said conducting members being electrically insulated from each other when said operating portion is not operated, conducting members of two or more combinations of said conducting members being electrically connected with each other when said operating portion is operated; output means for outputting an ON signal in the case where conducting members of a first predetermined combination of said conducting members are electrically connected with each other; and alarm means for outputting an alarm signal in the case where conducting members of a second predetermined combination of said conducting members are electrically connected with each other for a predetermined period of time.

In preferred embodiments, said case where conducting members of said first combination of said conducting members are electrically connected with each other is the case where conducting members of all combinations of said conducting members are electrically connected with each other.

In preferred embodiments, said case where conducting members of said second combination of said conducting members are electrically connected with each other is the case where conducting members of any one combination of said conducting members are electrically connected with each other.

In preferred embodiments, said output means comprises a logic circuit.

Another switch apparatus according to the invention has a membrane structure and comprises an operating portion, said switch apparatus being able to be activated when said operating portion is operated, and further comprises: three or more conducting members, said conducting members being electrically insulated from each other when said operating portion is not operated, two or more combinations of said conducting members being electrically connected when said operating portion is operated; output means for outputting an ON signal when a first predetermined combination of said conducting members is electrically connected for a first predetermined period of time; and alarm means for outputting an alarm signal when a second predetermined combination of said conducting members is electrically connected for a second predetermined period of time.

In preferred embodiments, said case where conducting members of said first combination of said conducting members are electrically connected with each other is the case where conducting members of all combinations of said conducting members are electrically connected with each other.

In preferred embodiments, said case where conducting members of said second combination of said conducting members are electrically connected with each other is the case where conducting members of any one combination of said conducting members are electrically connected with each other.

In preferred embodiments, said second predetermined period of time is longer than said first predetermined period of time.

Thus, the invention described herein makes possible the objectives of:

(1) providing a switch apparatus in which the reliability of a membrane switch is enhanced, so that the switch apparatus can be used in an electronic apparatus such as a medical device which is required to have high reliability; and (2) providing a switch apparatus having high reliability which can reliably detect failures even when a short-circuit occurs for only a short time.

In a membrane switch in which one conductor on a resin panel can contact with two conductors on a substrate, all combinations of the three conductors (three combinations) are short-circuited during the ON operation. In a membrane switch in which each of two conductors on a resin panel comes in contact with only the facing one of two conductors on a substrate, two combinations of the four conductors are short-circuited during the ON operation.

When the operating portion of the membrane switch is pressed, conductors facing each other come into contact, and conductors of all combinations or of a certain combination are short-circuited directly or indirectly. Even if a short-circuit failure occurs due to the peeling of a conductor in such a membrane switch, the probability that the short-circuits of the conductors of all combinations occur at a same time is extremely low. Also, even if the breaking failure between a conductor and a lead occurs due to the peeling of the conductor, the probability that the short-circuits of conductors of all combinations to be short-circuited during the normal ON operation cannot be detected is extremely low.

Therefore, if a switch apparatus comprises logic means which output the switch ON signal only when all conductors of two or more combinations are short-circuited, the switch can reliably turn ON during the ON operation, and does not erroneously turn ON even when a short-circuit failure occurs in a membrane switch. Furthermore, if a switch apparatus comprises logic means which output an ON signal only when conductors of only a part of combinations to be short-circuited are short-circuited, the switch apparatus can detect a short-circuit failure, which means that the switch apparatus can perform self-diagnosis.

If a switch apparatus comprises logic means which outputs an ON signal when conductors of at least one combination to be short-circuited are short-circuited, the switch apparatus can reliably turn ON by the operation even when a breakage failure of a conductor occurs in a membrane switch.

Accordingly, in the use of the switch apparatus of the invention, the logic means are appropriately selected in consideration of the function of the device, whereby the device can be kept in safety even when a failure occurs, i.e., it can attain fail safe operation.

According to the invention, a failure such as a short-circuit for a short time can be reliably detected in the following way. If conductors of a first predetermined combination are connected for a first predetermined time or longer, logic means judge that switch operation is performed so as to output a switch ON signal. If conductors of a second predetermined combination are connected for a second predetermined time or longer, logic means determine that the apparatus is in a failure state and an alarm signal is produced. In this case, it is preferable that the second predetermined time (e.g., 0.5 seconds) is set to be sufficiently shorter than the predetermined time for alarm in the prior art (e.g., 10 seconds).

BRIEF DESCRIPTION OF THE DRAWINGS

This invention may be better understood and its numerous objects and advantages will become apparent to those skilled in the art by reference to the accompanying drawings as follows:

FIG. 1 is a block diagram showing a switch apparatus according to the invention.

FIG. 2 is a vertical sectional view showing a membrane switch of the embodiment shown in FIG. 1.

FIG. 3 is a perspective view illustrating the structure of the membrane switch.

FIG. 8 is a vertical sectional view showing a membrane switch used in another embodiment of the invention.

FIG. 9 is an equivalent circuit diagram of the membrane switch used in the switch of FIG. 8.

FIG. 10 is a logic circuit diagram illustrating an example of output means used in the embodiment of FIG. 9.

DESCRIPTION OF THE PREFERRED EMBODIMENTS

Figure 4:
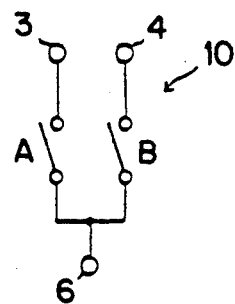
FIG. 4 is an equivalent circuit diagram of the membrane switch.

With reference to FIGS. 1 to 7, one embodiment of this invention is described. In the drawings, like reference numerals have been used for components which have like functions with those of the prior art shown in FIGS. 14 to 18.

As shown in FIG. 1, a switch apparatus of this embodiment comprises a membrane switch 10 and logic means 11 for detecting the short-circuit state between respective conductors of the membrane switch 10.

The configuration of the membrane switch 10 is now described referring FIGS. 2 and 3. Two electrically conductive patterns 3 and 4 in comb shape are alternately formed on a substrate 1 made of an insulating material, as shown in FIG. 3. On the conductive patterns 3 and 4 is located a spacer 5 made of an insulating material, as shown in FIG. 2. The spacer 5 has an opening 5a formed by a hole or the like above the conductive patterns 3 and 4. The opening 5a constitutes an operating portion. A resin panel 2 which is an elastic resin sheet made of an insulating material is disposed on the spacer 5. An electrically conductive pattern 6 is stuck on the reverse of the resin panel 2 at the operating portion. The conductive patterns 3 and 4 and the conductive pattern 6 have leads 3a, 4a and 6a, respectively, and the leads are connected to respective external terminals.

In the membrane switch 10, these conductive patterns 3 and 4, and the conductive pattern 6 are short-circuited in such a manner that by downwardly pressing the operating portion of the resin panel 2, the conductive patterns 3 and 4, and the conductive pattern 6 separated by the opening 5a in the spacer 5 come into contact. Thus, the membrane switch 10 is equivalent to a switch circuit having connections A and B shown in FIG. 4.

Figure 5:
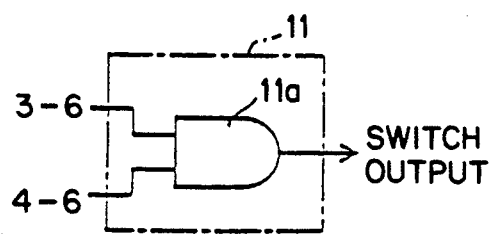
FIG. 5 is a logic circuit diagram illustrating an example of output means used in the embodiment of FIG. 1.

In this membrane switch 10, if a short-circuit occurs due to the peeling of the conductive pattern 6, the probability that either one of the connections A and B in the switch circuit of FIG. 4 is short-circuited is greatly high. The logic means 11 comprises an AND gate 11a as shown in FIG. 5. Therefore, a switch ON signal can be output only when both the connections A and B are short-circuited. In other words, the short-circuit between the conductive pattern 3 and the conductive pattern 6 is detected, based on the conductive condition between the terminals respectively through the leads 3a and 6a. The short-circuit between the conductive pattern 4 and the conductive pattern 6 is detected based on the conductive condition between the terminals respectively through the leads 4a and 6a. A high level logic is output and applied to the AND gate 11a when short-circuited, so that a switch ON signal can be output only when both the connections between the conductive pattern 3 and the conductive pattern 6 and between the conductive pattern 4 and the conductive pattern 6 are short-circuited.

Consequently, using the logic means 11 shown in FIG. 5, a switch apparatus can be obtained which reliably turns ON when operated and does not erroneously turn ON even when a short-circuit failure of the membrane switch 10 occurs.

Figure 6:
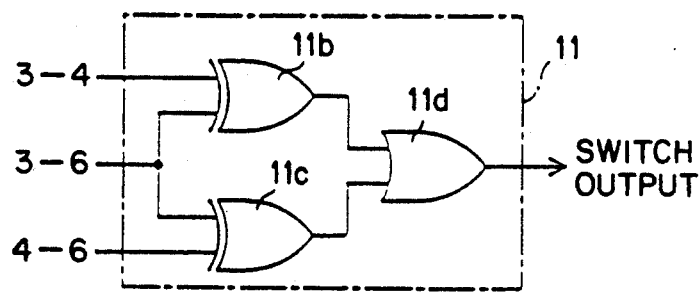
FIG. 6 is a logic circuit diagram illustrating another example of output means used in the embodiment of FIG. 1.

The logic means 11 may consist of XOR (exclusive OR) gates 11b and 11c, and an OR gate 11d as shown in FIG. 6. In this embodiment, a switch ON signal can be output when the conductors of only a part of three combinations between the conductive patterns 3 and 4 and the conductive pattern 6 are short-circuited. Thus, it can be determined that a short-circuit failure occurs in the membrane switch 10 due to peeling, based on the detection that the switch ON state continues for the predetermined time or longer. The reason why the switch ON state is required to continue for the predetermined time or longer is that, in the operation, one of the connections may momentarily be short-circuited prior to both the short circuits of the connections A and B. In this case, it is required that the operation of the membrane switch 10 should be detected separately by the logic means 11 shown in FIG. 5 or the like.

As a result, according to the logic means 11 shown in FIG. 6, it is possible that the membrane switch 10 has a self-diagnosis function.

Figure 7:
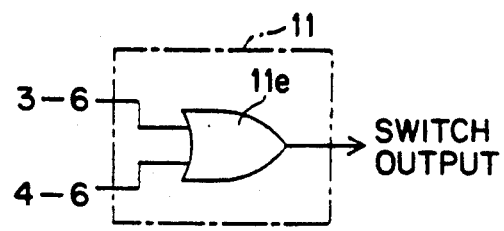
FIG. 7 is a logic circuit diagram illustrating still another example of output means used in the embodiment of FIG. 1.

If the logic means 11 is constituted by an OR gate 11e shown in FIG. 7, even when a break occurs between the conductive pattern 3 or 4 and the lead 3a or 4a, a short circuit of the connection A or B can be detected so that a switch ON signal can be output. As a result, a switch apparatus can be obtained which can be turned ON by the operation, when a failure due to a breaking of wire occurs in the membrane switch 10.

In the above-described case, if a break occurs between the conductive pattern 6 and the lead 6a due to the peeling of the conductive pattern 6, the switch can not be turned ON. Therefore, in this case, the membrane switch 10 may be constructed as shown in FIG. 8. Namely, two separated conductive patterns 3 and 4 are formed on the substrate 1, and two separated conductive patterns 7 and 8 are formed on the reverse of the resin panel 2 so as to face the conductive patterns 3 and 4, respectively. The thus constructed membrane switch 10 is equivalent to the switch circuit shown in FIG. 9. The logic means 11 consists of an OR gate 11f as shown in FIG. 10. According to this embodiment, even when a break occurs between the conductive pattern 7 or 8 and its lead (not shown) due to the peeling of the conductive pattern 7 or 8, the short-circuit of either one of the connection A or B is detected, and a switch ON signal can be output. As a result, a switch apparatus can be obtained which can reliably turn ON, even when a break failure occurs in any one of conductive patterns 3, 4, 7 and 8. In the embodiments, the logic means 11 may be realized by software instead of a logic circuit such as a TTL.

Figure 11:
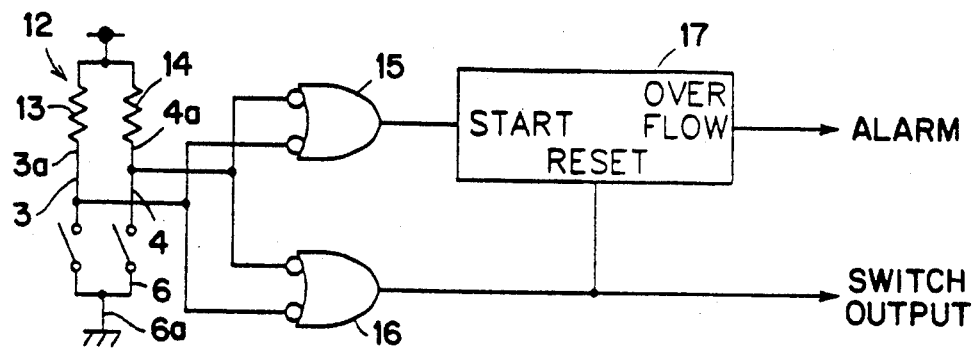
FIG. 11 is a circuit diagram showing another embodiment of the invention.

Another switch apparatus according to the invention is shown in FIG. 11. The switch apparatus of this embodiment comprises a membrane switch 12, an OR gate 15, an AND gate 16 and a timer 17. The operating portion of the membrane switch 12 is constructed in the same manner as that of the above-described membrane switch 10, except that the leads 3a and 4a of the conductive patterns 3 and 4 are connected to a constant voltage source through resistors 13 and 14, respectively, and the lead 6a of the conductive pattern 6 is grounded. The conductive patterns 3 and 4 are connected to the OR gate 15 and the AND gate 16, respectively. The output of the OR gate 15 is coupled to the start terminal of the timer 17, and the output of the AND gate 16 is coupled to the reset terminal of the timer 17. The output of the AND gate 16 is also output to the external as an output of the switch apparatus. The overflow terminal of the timer 17 which becomes high after a predetermined time elapses is connected to an alarm means outside the figure.

In this switch apparatus, by pressing the operating portion, the conductive pattern 6 and the conductive patterns 3 and 4 come into contact so as to be short-circuited, and the potentials of the conductive patterns 3 and 4 become low. As described above, however, since the conductive pattern 6 does not come into contact with the conductive patterns 3 and 4 completely at the same time in practice, the conductive patterns 3 and 4 do not simultaneously become low. The potential is sometimes unstable at the moment when the state of the conductors changes from a non-contact one to a contact one, or conversely at the moment when the state of the conductors changes from the contact one to the non-contact one. Since such an unstable state continues for about 100 milliseconds at the most, the set time of the timer 17 is preferably about 0.5 to 1.0 second. Thus, in some cases, one of the conductive patterns 3 and 4 (e.g., the conductive pattern 3) first becomes low, and at that time the other one (the conductive pattern 4) remains high. In such a case, the output of the OR gate 15 becomes high, and the timer 17 starts to count. When the operating portion is normally operated, this immediately causes the conductive pattern 4 to become low. Therefore, the output of the AND gate 16 becomes high, the timer 17 is reset, and the switch ON signal is output.

When the conductive pattern 6 comes into contact with either one of the conductive patterns 3 and 4 (e.g., the conductive pattern 3) due to the peeling of the conductor, only the conductive pattern 3 becomes low, and the conductive pattern 4 remains high. Accordingly, the output of the OR gate 15 becomes high, and the timer 17 starts to count. After the set time of the timer 17 (e.g., 0.5 second) elapses, the overflow terminal of the timer 17 becomes high so that the alarm means is activated to alert the failure. As described above, according to the invention, a short-circuit failure in for short time can be detected.

Figure 12:
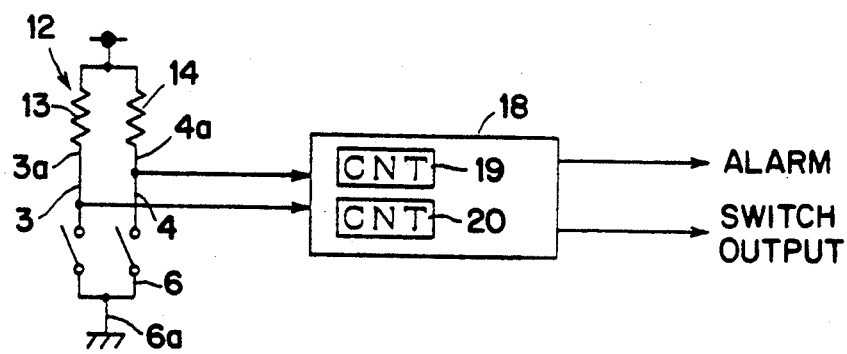
FIG. 12 is a circuit diagram showing still another embodiment of the invention.

Still another embodiment is shown in FIG. 12. In this embodiment, the structure of the operating portion of the membrane switch 12 is the same as that of the above-described membrane switch 10, and the structure of the conductive patterns 3 and 4, leads 3a and 4a and resistors 13 and 14 is the same as that of the embodiment shown in FIG. 11. The leads 3a and 4a are connected to a microcomputer 18 via appropriate interfaces (not shown). The microcomputer 18 comprises two counters 19 and 20. The first counter 19 counts time during which both the conductive patterns 3 and 4 are in contact with the conductive pattern 6. The second counter 20 counts time during which one of the conductive patterns 3 and 4 is in contact with the conductive pattern 6 (i.e., the period during which the state may be abnormal).

Figure 13:
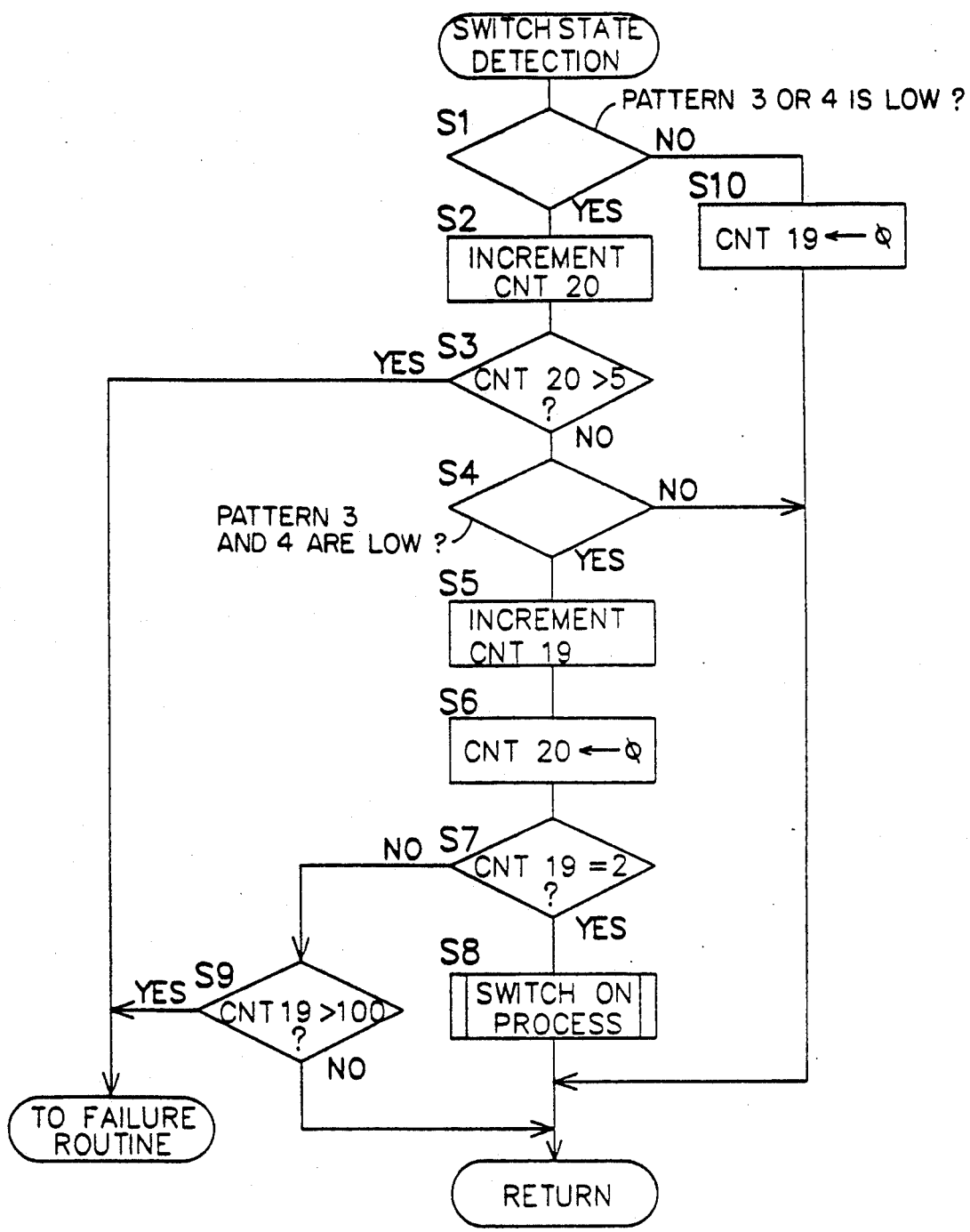
FIG. 13 is a flowchart of the embodiment.
Figure 14:
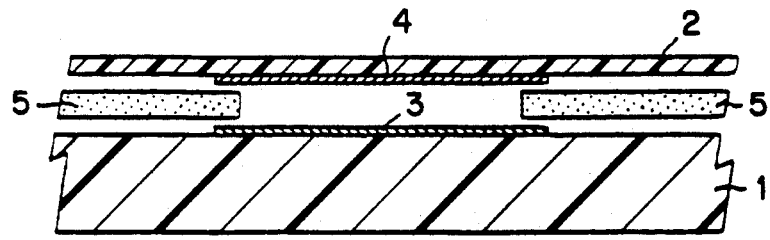
FIG. 14 is a vertical sectional view showing a membrane switch of the prior art.
Figure 15:
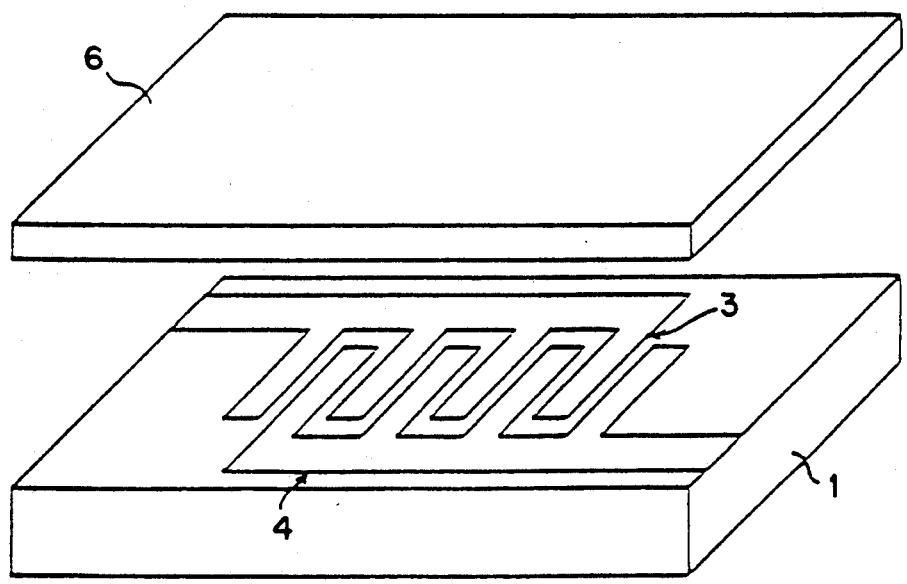
FIG. 15 is a perspective view illustrating the structure of the membrane switch of the prior art.
Figure 16:
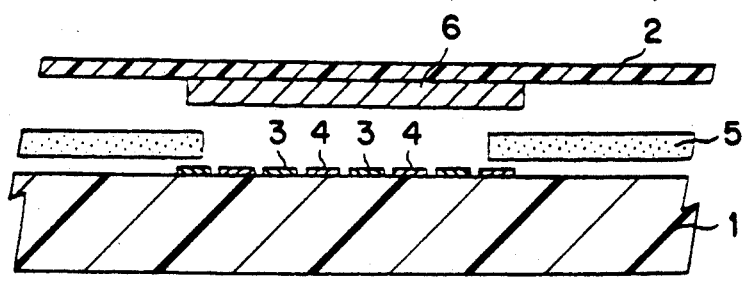
FIG. 16 is a vertical sectional view showing another membrane switch of the prior art.
Figure 17:
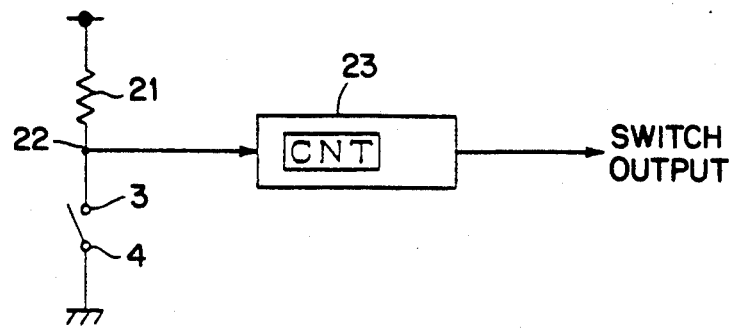
FIG. 17 is a circuit diagram of still another prior art apparatus.
Figure 18:
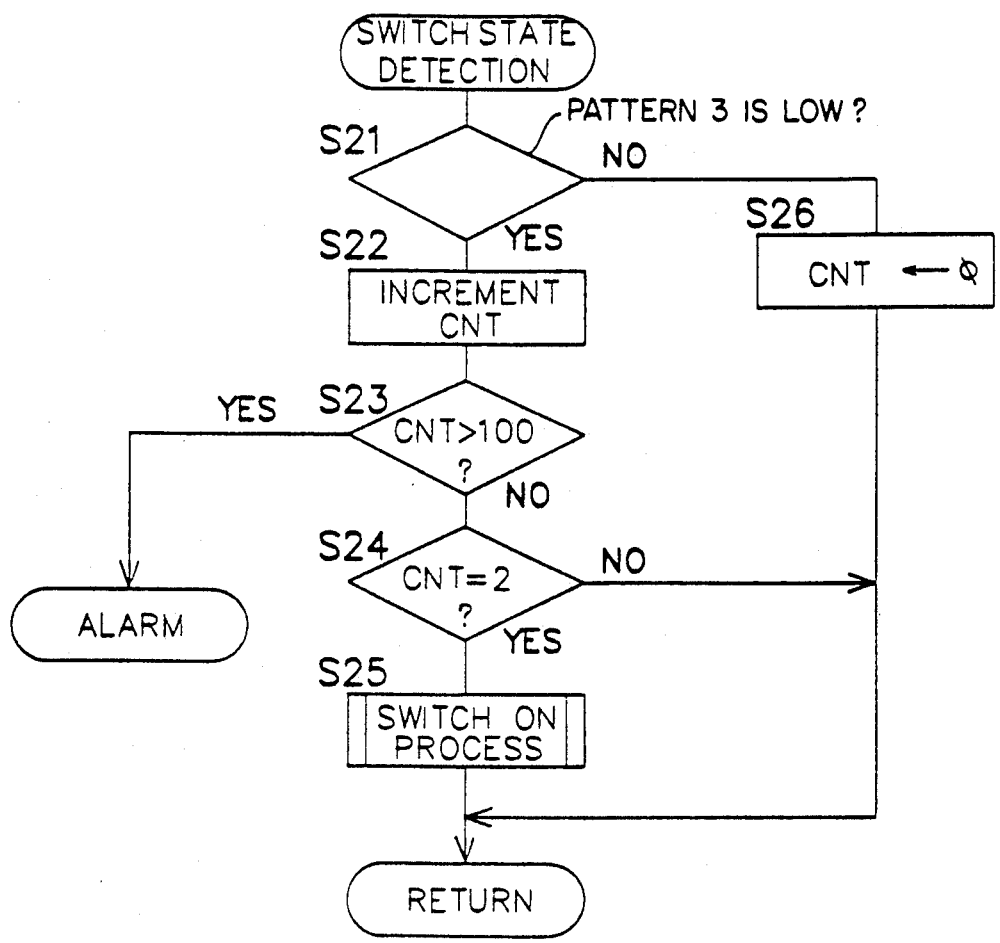
FIG. 18 is a flowchart of the prior art apparatus.

The microcomputer 18 calls a switch state detecting routine (FIG. 13) every 100 milliseconds by a timer interruption. When the switch state detecting routine is called, it is examined whether the potential of at least one of the conductive patterns 3 and 4 is low or not (step S1). If both the conductive patterns 3 and 4 are high (i.e., no operation is performed in the operating portion and no short circuit occurs), the first counter 19 is reset (step S10), and the process returns to the main routine. When the potential of at least one of the conductive patterns 3 and 4 is low at step S1, the second counter 20 is incremented by 1 (step S2), and thereafter it is examined whether the contents of the second counter 20 are greater than 5 or not (step S3). When the contents of the second counter 20 are greater than 5 (in other words, when only one of the conductive patterns 3 and 4 comes in contact with the conductive pattern 6 for 0.5 seconds or more), it is judged that a failure has occurred, so that a failure process routine is called. When the contents of the second counter 20 is less than 5, the process proceeds to step S4. In step S4, it is examined whether both the potentials of the conductive patterns 3 and 4 are low or not. In the case where the operating portion is not operated, both the potentials of the conductive patterns 3 and 4 are high, so that this routine is ended and the process returns to the main routine. When the operating portion is normally operated, the conductive pattern 6 comes into contact with both the conductive patterns 3 and 4, so that both the potentials of the conductive patterns 3 and 4 become low. Accordingly, the first counter 19 is incremented by 1 (step S5), and the second counter 20 is reset (step S6). Next, it is examined whether the contents of the first counter 19 are equal to 2 or not (step S7). If YES, the switch ON process is performed (step S8). Thus, when the normal operation continues for about 0.2 seconds or more, the switch turns ON. When the operating portion is continuously pressed for 10 seconds or more, the process proceeds from step S9 to the failure process routine to alert the failure.

As described above, in this embodiment, when both the conductive patterns 3 and 4 continuously contact with the conductive pattern 6 for 0.2 seconds or more, a switch ON process is performed. When only one of the conductive patterns 3 and 4 contacts with the conductive pattern 6 continuously for 0.5 seconds or more, the alarm alerts a failure. Thus, in the switch apparatus of this embodiment, a failure of short time short-circuit resulting from vibration can be detected, thereby attaining high reliability.

As seen from the above description, the switch apparatus of this invention can achieve failsafe operation of the device by detecting a failure of a membrane switch, so that the switch apparatus can be used in a device which is required to have high reliability such as a medical device. Furthermore, the switch apparatus can reliably detect a failure by its self-diagnosis function, thereby enhancing its reliability.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A switch apparatus having a membrane structure and comprising an operating portion, said switch apparatus being able to be activated when said operating portion is operated,
   said switch apparatus further comprises:
   at least three conducting members, said conducting members being electrically insulated from each other when said operating portion is not operated, conducting members of at least one combination of said conducting members being electrically connected with each other when said operating portion is operated;
   means for separately detecting when a first of said conducting members is electrically connected with a second of said conducting members and when said second conducting member is electrically connected with a third of said conducting members; and
   output means for outputting an ON signal when said means for detecting has detected that at least one of said first and second or said second and third conducting members are electrically connected together.

2. A switch apparatus according to claim 1, wherein said output means comprises a logic circuit.

3. A switch according to claim 2, wherein said logic circuit includes an AND gate.

4. A switch according to claim 2, wherein said logic circuit includes an OR gate.

5. A switch according to claim 2, wherein said means for detecting detects when said first and third conducting members are electrically connected.

6. A switch according to claim 5, wherein said logic circuit includes an OR gate receiving the output of two exclusive OR gates.

7. A switch apparatus in accordance with claim 1, wherein said output means outputs an ON signal when said first and second conducting members are electrically connected and said second and third conducting members are electrically connected.

8. A switch according to claim 1, wherein said second conducting member is comprised of two separate conducting members.

9. A switch according to claim 1, wherein said second conducting member is affixed to said membrane structure.

10. A switch apparatus having a membrane structure and comprising an operating portion, said switch apparatus being able to be activated when said operating portion is operated,
    said switch apparatus further comprises:
    at least three conducting members, said conducting members being electrically insulated from each other when said operating portion is not operated, conducting members of at least one combination of said conducting members being electrically connected with each other when said operating portion is operated;
    means for separately detecting when a first of said conducting members is electrically connected with a second of said conducting members and when said second conducting member is electrically connected with a third of said conducting members;
    output means for outputting an ON signal in the case where conducting members of a first predetermined combination of said conducting members are electrically connected with each other; and
    alarm means for outputting an alarm signal in the case where conducting members of a second predetermined combination of said conducting members are electrically connected with each other for a predetermined period of time.

11. A switch apparatus according to claim 10, wherein said case where conducting members of said first combination of said conducting members are electrically connected with each other is the case where conducting members of all combinations of said conducting members are electrically connected with each other.

12. A switch apparatus according to claim 10, wherein said case where conducting members of said second combination of said conducting members are electrically connected with each other is the case where conducting members of any one combination of said conducting members are electrically connected with each other.

13. A switch apparatus according to claim 10, wherein said output means comprises a logic circuit.

14. A switch according to claim 10, wherein said detecting means includes means for grounding said second conducting member.

15. A switch apparatus having a membrane structure and comprising an operating portion, said switch apparatus being able to be activated when said operating portion is operated,
    said switch apparatus further comprises:
    at least three conducting members, said conducting members being electrically insulated from each other when said operating portion is not operated, at least one combination of said conducting members being electrically connected when said operating portion is operated;

means for separately detecting when a first of said conducting members is electrically connected with a second of said conducting members and when said second conducting member is electrically connected with a third of said conducting members;

output means for outputting an ON signal when a first predetermined combination of said conducting members is electrically connected for a first predetermined period of time; and alarm means for outputting an alarm signal when a second predetermined combination of said conducting members is electrically connected for a second predetermined period of time.

16. A switch apparatus according to claim 15, wherein said first predetermined combination of said conducting members includes all of said conducting members.

17. A switch apparatus according to claim 15, wherein said second predetermined combination of said conducting members includes any one combination of two of said conducting members.

18. A switch apparatus according to claim 15, wherein said second predetermined period of time is longer than said first predetermined period of time.

19. A switch apparatus having a membrane structure and comprising an operating portion, said switch apparatus being able to be activated when said operating portion is operated, said switch apparatus further comprises:

at least three conducting members, said conducting members being electrically insulated from each other when said operating portion is not operated, conducting members of at least one combination of said conducting members being electrically connected with each other when said operating portion is operated;

means for separately detecting when a first of said conducting members is electrically connected with a second of said conducting members and when said second conducting member is electrically connected with a third of said conducting members;

output means for outputting an ON signal when said first and second conducting members are electrically connected and said second and third conducting members are electrically connected and when said means for detecting has detected that at least one of said first and second or said second and third conducting members are electrically connected together.

* * * * *

UNITED STATES PATENT AND TRADEMARK OFFICE
CERTIFICATE OF CORRECTION

PATENT NO. : 5,175,443
DATED : December 29, 1992
INVENTOR(S) : Masazumi Tabuchi

It is certified that error appears in the above-identified patent and that said Letters Patent is hereby corrected as shown below:

IN THE DRAWINGS:

In Figure 11, modify the left hand curved line of logic element 16 indicative of an OR gate and insert a straight vertical line thus indicating that element 16 is an AND gate.

Signed and Sealed this

Thirtieth Day of November, 1993

BRUCE LEHMAN

Attest:

Attesting Officer

Commissioner of Patents and Trademarks